(12) United States Patent
Tanimoto et al.

(10) Patent No.: US 11,170,988 B2
(45) Date of Patent: Nov. 9, 2021

(54) METHOD OF DOUBLE-SIDE POLISHING SILICON WAFER

(71) Applicant: SUMCO CORPORATION, Tokyo (JP)

(72) Inventors: Ryuichi Tanimoto, Tokyo (JP); Ichiro Yamazaki, Tokyo (JP); Shunsuke Mikuriya, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/638,796

(22) PCT Filed: Aug. 31, 2017

(86) PCT No.: PCT/JP2017/031496
§ 371 (c)(1),
(2) Date: Feb. 13, 2020

(87) PCT Pub. No.: WO2019/043895
PCT Pub. Date: Mar. 7, 2019

(65) Prior Publication Data
US 2020/0185215 A1    Jun. 11, 2020

(51) Int. Cl.
*H01L 21/02* (2006.01)
*H01L 21/302* (2006.01)
(Continued)

(52) U.S. Cl.
CPC ........ *H01L 21/02024* (2013.01); *B24B 7/228* (2013.01); *H01L 21/302* (2013.01);
(Continued)

(58) Field of Classification Search
None
See application file for complete search history.

(56) References Cited

U.S. PATENT DOCUMENTS

| 5,010,692 A * | 4/1991 | Ishida ................ B24B 7/16 |
| | | 451/287 |
| 8,728,942 B2 * | 5/2014 | Ogata ............ H01L 21/02024 |
| | | 438/692 |

(Continued)

FOREIGN PATENT DOCUMENTS

| JP | 2001-1242 A | 1/2001 |
| JP | 2001-260013 A | 9/2001 |

(Continued)

OTHER PUBLICATIONS

ISR issued in PCT/JP2017/031496, dated Dec. 5, 2017.
(Continued)

*Primary Examiner* — Stephanie P Duclair
(74) *Attorney, Agent, or Firm* — Greenblum & Bernstein, P.L.C.

(57) ABSTRACT

Provided is a method of double-side polishing a silicon wafer using a double-side polishing apparatus, the method including in succession: a first polishing step of performing double-side polishing while supplying a first polishing agent that is an alkaline aqueous solution containing abrasive grains to the polishing cloths; a polishing agent switching step of stopping the supply of the first polishing agent and starting the supply of a second polishing agent that is an alkaline aqueous solution containing a water-soluble polymer with no abrasive grains, with the polishing cloths of the upper plate and the lower plate being in contact with the front surface and the back surface of the silicon wafer, respectively and with the upper plate and the lower plate being continuously rotated; and a second polishing step of performing double-side polishing while supplying the second polishing agent to the polishing cloths.

4 Claims, 5 Drawing Sheets

(51) Int. Cl.
*H01L 21/321* (2006.01)
*H01L 21/306* (2006.01)
*H01L 21/304* (2006.01)
*B24B 7/22* (2006.01)
*B24B 37/04* (2012.01)

(52) U.S. Cl.
CPC .......... *H01L 21/304* (2013.01); *H01L 21/306* (2013.01); *H01L 21/30625* (2013.01); *H01L 21/3212* (2013.01)

(56) References Cited

U.S. PATENT DOCUMENTS

| | | | |
|---|---|---|---|
| 8,932,952 B2 * | 1/2015 | Ogata | B24B 37/044 438/692 |
| 9,193,026 B2 * | 11/2015 | Schwandner | B24B 37/08 |

| | | | |
|---|---|---|---|
| 2010/0009155 A1 | 1/2010 | Hashii et al. | |
| 2012/0156878 A1 | 6/2012 | Ogata et al. | |

FOREIGN PATENT DOCUMENTS

| | | |
|---|---|---|
| JP | 2010-21487 A | 1/2010 |
| JP | 2011-42536 A | 3/2011 |
| JP | 2012-25873 A | 2/2012 |
| JP | 5754659 B2 | 7/2015 |
| JP | 2017-104958 A | 6/2017 |
| TW | 201137100 A | 11/2011 |

OTHER PUBLICATIONS

Office Action issued in Taiwanese App. No. 107122734, dated Apr. 12, 2019 (w/translation).

IPRP issued in PCT/JP2017/031496, dated Mar. 3, 2020 (w/translation).

* cited by examiner

FIG. 1

| Step ID | Step | Supply of first polishing agent (containing abrasive grains) | Supply of second polishing agent (with no abrasive grains) | Polishing plates | |
|---|---|---|---|---|---|
| | | | | Contact with wafer | Rotation |
| S1 | First polishing step | Supplied | Not supplied | Contact (Engaged) | yes |
| S20 | Polishing agent switching step | Not supplied | Supplied | Contact (Engaged) | yes |
| S6 | Second polishing step | Not supplied | Supplied | Contact (Engaged) | yes |
| S7 | Pure water rinsing step | Not supplied | Not supplied | Contact (Engaged) | yes |
| S8 | Wafer & carrier removal | Not supplied | Not supplied | No contact (Disengaged) | no |
| S9 | Polishing cloth cleaning step | Not supplied | Not supplied | No contact (Disengaged) | no |
| S10 | Wafer & carrier loading | Not supplied | Not supplied | No contact (Disengaged) | no |

FIG. 2

| Step ID | Step | Supply of first polishing agent (containing abrasive grains) | Supply of second polishing agent (with no abrasive grains) | Polishing plates | |
|---|---|---|---|---|---|
| | | | | Contact with wafer | Rotation |
| S1 | First polishing step | Supplied | Not supplied | Contact (Engaged) | yes |
| S2 | Pure wager rinsing step | Not supplied | Not supplied | Contact (Engaged) | yes |
| S3 | Wafer & carrier removal | Not supplied | Not supplied | No contact (Disengaged) | no |
| S4 | Pure wager rinsing step | Not supplied | Not supplied | No contact (Disengaged) | no |
| S5 | Wafer & carrier loading | Not supplied | Not supplied | No contact (Disengaged) | no |
| S6 | Second polishing step | Not supplied | Supplied | Contact (Engaged) | yes |
| S7 | Pure water rinsing step | Not supplied | Not supplied | Contact (Engaged) | yes |
| S8 | Wafer & carrier removal | Not supplied | Not supplied | No contact (Disengaged) | no |
| S9 | Polishing cloth cleaning step | Not supplied | Not supplied | No contact (Disengaged) | no |
| S10 | Wafer & carrier loading | Not supplied | Not supplied | No contact (Disengaged) | no |

FIG. 3

| Step ID | Step | Supply of first polishing agent (containing abrasive grains) | Supply of second polishing agent (with no abrasive grains) | Polishing plates | |
|---|---|---|---|---|---|
| | | | | Contact with wafer | Rotation |
| S1 | First polishing step | Supplied | Not supplied | Contact (Engaged) | yes |
| S2 | Pure water rinsing step | Not supplied | Not supplied | Contact (Engaged) | yes |
| S6 | Second polishing step | Not supplied | Supplied | Contact (Engaged) | yes |
| S7 | Pure water rinsing step | Not supplied | Not supplied | Contact (Engaged) | yes |
| S8 | Wafer & carrier removal | Not supplied | Not supplied | No contact (Disengaged) | no |
| S9 | Polishing cloth cleaning step | Not supplied | Not supplied | No contact (Disengaged) | no |
| S10 | Wafer & carrier loading | Not supplied | Not supplied | No contact (Disengaged) | no |

*FIG. 4*

| Step | Pressure | Supply of first polishing agent (containing abrasive grains) | Supply of second polishing agent (with no abrasive grains) | Recovery line | Waste line |
|---|---|---|---|---|---|
| First polishing step | 250g/cm² → | → | | | |
| | 250g/cm² Reduction (10s) → | | | → | |
| Second polishing step | 200g/cm² → | | → | | → |

FIG. 5

METHOD OF DOUBLE-SIDE POLISHING SILICON WAFER

TECHNICAL FIELD

This disclosure relates to a method of simultaneously polishing a front surface and a back surface of a silicon wafer.

BACKGROUND

A process for producing a silicon wafer mainly includes a single crystal pulling step for forming a single crystal ingot and a step of processing the formed single crystal ingot. This processing step typically includes a slicing step, a lapping step, a beveling step, an etching step, a polishing step, a cleaning step, etc., and through these steps, a silicon wafer having a mirror-finished surface is produced.

Figure 5:
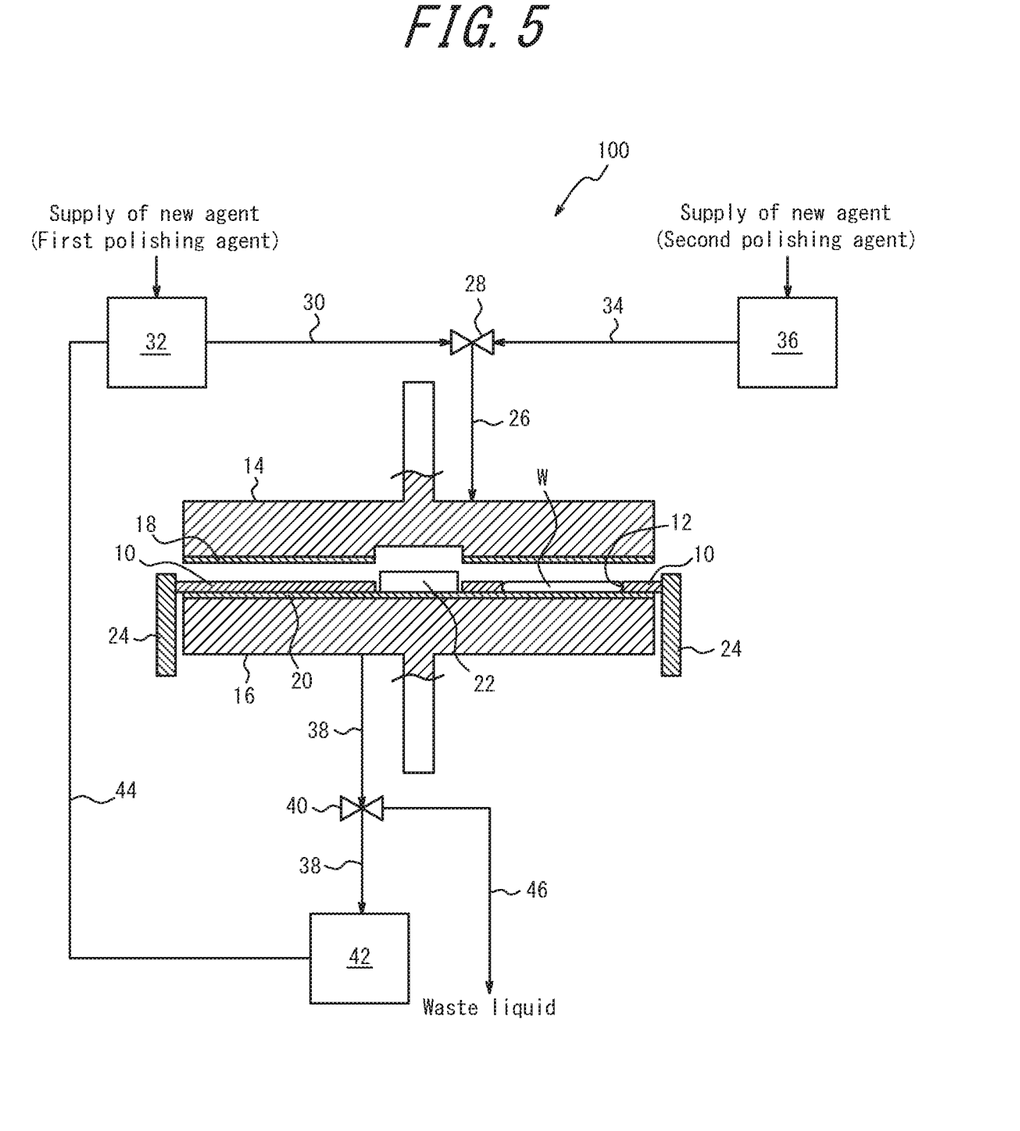
FIG. 5 is a schematic view of a double-side polishing apparatus 100 used in a method of double-side polishing a silicon wafer according to one embodiment of this disclosure.

In the polishing step, chemical mechanical polishing (CMP) is typically used, in which a silicon wafer and a polishing cloth are relatively rotated and rubbed against each other. As is known, in CMP, the mechanical polishing action of abrasive grains in a polishing agent and the chemical polishing action of the polishing agent (alkaline aqueous solution) are combined, thus excellent smoothness is obtained. In this polishing step, the polishing is performed in multiple stages of for example, a double-side polishing step (rough grinding step) of simultaneously polishing the front and back surfaces of a silicon wafer using a double-side polishing apparatus as illustrated in FIG. 5, followed by a finish polishing step of mirror-finishing at least one side of the silicon wafer.

Rough grinding in an initial stage is performed with a view to polishing a silicon wafer to a desired thickness. Double-side polishing is performed by polishing under a condition of a relatively high polishing rate using a hard polishing cloth for example made of polyurethane thereby obtaining a planarized silicon wafer with reduced variation in thickness. Finish polishing in a final stage is performed with a view to reducing the roughness of the surface of the silicon wafer. Single-side polishing is performed using a soft polishing cloth like suede and fine free abrasive grains thereby reducing the surface roughness of minute irregularities on the silicon wafer surface, such as nanotopography or haze.

JP 5754659 B (PT1—see Claims 1 and 2, Example 1, etc.) discloses a method for polishing silicon wafers comprising: a rough polishing step of simultaneously polishing a front surface and a rear surface of the silicon wafer; and a finish polishing step of finish polishing the rough polished surface after the rough polishing, wherein the rough polishing includes a first-step polishing of eliminating a native oxide film using a polishing liquid containing free abrasive grains, and a second-step polishing of polishing the front and rear surfaces of the silicon wafer from which the native oxide films have been eliminated using a polishing liquid in which a water-soluble polymer is added to an amine aqueous solution with no free abrasive grains so that the polishing amount of the silicon water is 5 μm to 10 μm one side after the first-step polishing. In addition, in Example 1, the second-step polishing is performed using a double-side polishing apparatus used in the first-step polishing.

CITATION LIST

Patent Literature

PTL 1: JP 5754659 B

SUMMARY

Technical Problem

The two-stage rough polishing described in PTL 1 is performed based on the design concept as described below That is, in the rough polishing step using a double-side polishing apparatus, the amount of polishing is likely larger in a peripheral portion of a wafer as compared with the center thereof, and this results in a problem of roll-off of the peripheral portion of the wafer. To address this problem, in PTL 1, the rough polishing is performed using a polishing liquid containing a water-soluble polymer with no abrasive grains, and the roll off amount (ROA) of the peripheral portion of the wafer is reduced by the action of the water-soluble polymer. Further, in most cases, a native oxide film with a thickness of around 5 angstrom to 20 angstrom is formed on the silicon wafer before the rough polishing step, and the native oxide film is hardly removed by a polishing liquid with no abrasive grains. This being the case, the native oxide film is removed by performing a first-step polishing using a polishing liquid containing abrasive grains. In Example 1 of PTL 1, the first-step polishing including the removal of the native oxide film with an amount of polishing of 0.5 μm for one side (1 μm for both surfaces) and second-step polishing with an amount of polishing of 5 μm for one side (10 μm for both surfaces) are performed.

However, in the double-side polishing method described in PTL 1, switching of the polishing liquids between the first-step polishing using the polishing liquid containing abrasive grains and the second-step polishing using the polishing liquid containing no abrasive grains in the case of performing the first-step polishing and the second-step polishing using a common double-side polishing apparatus is not discussed. The studies made by the inventors of this disclosure demonstrated that the carrier plate was oscillated at the start of the second-step polishing depending on how the switching of the polishing agents is performed, and the oscillation caused micro scratches on the front and back surfaces of the silicon wafer during polishing.

In light of the above problems, it could be helpful to provide a method of double-side polishing a silicon wafer, which can prevent the formation of micro scratches on the front and back surfaces of the silicon wafer during polishing.

Solution to Problem

The inventors of this disclosure have conducted diligent studies to solve the above problems and found the following. In double-side polishing, the used polishing agent is typically recovered into a polishing agent supply tank and recycled to be repeatedly used as a polishing agent. In this regard, when first-stage polishing and second-stage polishing are performed using a common double-side polishing apparatus, a method of supplying pure water to polishing cloths at the same time as the termination of the supply of a polishing agent to the polishing cloths after the end of the first-stage polishing in order to prevent mixing of the polishing agent used in the first-stage polishing and the polishing agent used in the second-stage polishing thus removing the abrasive grains attached to the wafer and the carrier plate and cleaning the polishing cloths with pressurized water can be conceived. However, in such a case, the carrier plate was found to be oscillated along with the generation of noise from the carrier plate at the start of the second-stage polishing. Since the rotation of the upper and lower plates is resumed in the absence of abrasive grains, the pressing force from the polishing cloths is directly applied to the carrier plate. Accordingly, the frictional resistance between the wafer along with the carrier plate and the polishing cloths increases, thus the oscillation is considered to be caused due to the increased pressure load on the wafer from the upper and lower plates. In view of the above, the inventors studied techniques to switch the polishing agents without resuming the rotation of the upper and lower plates in the absence of abrasive grains. They contemplated reducing the oscillation of the carrier plate by establishing a transition period during which polishing is performed in the presence of both the polishing agent used in the first-stage polishing and the polishing agent used in the second-stage polishing being deliberately mixed instead of preventing mixing of the polishing agents and experimentally demonstrated that the idea was right.

This disclosure is based on the above findings, and we propose the following features.

(1) A method of double-side polishing a silicon wafer using a double-side polishing apparatus including a carrier plate having one or more retainer openings for retaining the silicon wafer, and an upper plate and a lower plate which each have a surface provided with a polishing cloth and are situated to face each other with the carrier plate therebetween, for simultaneously polishing a front surface and a back surface of the silicon wafer by relatively rotating the upper plate and the lower plate with respect to the carrier plate in rotation with the polishing cloths of the upper plate and the lower plate being in contact with the front surface and the back surface of the silicon wafer loaded in each retainer opening, respectively, comprising in succession:

a first polishing step of performing double-side polishing while supplying a first polishing agent that is an alkaline aqueous solution containing abrasive grains to the polishing cloths;

subsequent to the first polishing step, a polishing agent switching step of stopping the supply of the first polishing agent and starting the supply of a second polishing agent that is an alkaline aqueous solution containing a water-soluble polymer with no abrasive grains, with the polishing cloths of the upper plate and the lower plate being in contact with the front surface and the back surface of the silicon wafer, respectively and with the upper plate and the lower plate being continuously rotated; and a second polishing step of performing double-side polishing while supplying the second polishing agent to the polishing cloths after the polishing agent switching step.

(2) The method of double-side polishing a silicon wafer, according to (1) above, wherein with respect to surface pressure applied to the front surface and the back surface of the silicon wafer by the upper plate and the lower plate, in the first polishing step, the double-side polishing is performed at a first surface pressure and the surface pressure is reduced in a last stage of the first polishing step to a second surface pressure that is lower than the first surface pressure at the end of the first polishing step, and the double-side polishing is performed at the second surface pressure in the second polishing step.

(3) The method of double-side polishing a silicon wafer, according to (2) above, wherein the second surface pressure is lower than the first surface pressure by 5% to 40%.

(4) The method of double-side polishing a silicon wafer, according to any one of (1) to (3) above, wherein in the first polishing step, the double-side polishing is performed to achieve a polishing amount of 80% to 99.5% with respect to a total polishing amount of the first and second polishing steps, and in the second polishing step, the double-side polishing is performed in a polishing amount of 0.05 μm to 0.5 μm on each surface.

(5) The method of double-side polishing a silicon wafer, according to any one of (1) to (4) above, wherein in the first polishing step, the first polishing agent having been used is recovered and then resupplied to the polishing cloths, and in the second polishing step, the polishing agent having been used is recovered and then disposed of.

Advantageous Effect

The method of double-side polishing a silicon wafer can prevent the formation of micro scratches on the front and back surfaces of the silicon wafer during polishing.

DETAILED DESCRIPTION

First, referring to FIG. 5, the basic structure of the double-side polishing apparatus 100 used in the method of double-side polishing a silicon wafer according to one embodiment of this disclosure is described. The double-side polishing apparatus 100 has a carrier plate 10, and an upper plate 14 and a lower plate 16 situated to face each other with the carrier plate 10 therebetween. The carrier plate 10 is provided with a plurality of retainer openings 12 (one of them is illustrated as a representative in FIG. 5) for retaining silicon wafers W, and the silicon wafers W are loaded in the respective retainer openings 12. Surfaces of the upper and lower plates 14 and 16 are provided with polishing cloths 18 and 20, respectively. A sun gear 22 is provided at the center of the upper and lower plates 14 and 16, and an internal gear 24 is provided around the plates.

A polishing agent is supplied through a polishing agent supply line 26 to the space between the upper and lower plates 14 and 16 via a channel extending through the upper plate 14 in the vertical direction. The details of a supply/recovery system for the polishing agent will be described hereafter.

With the double-side polishing apparatus 100, the plurality of silicon wafers W loaded in the plurality of openings 12 are sandwiched between the upper plate 14 and the lower plate 16, and the sun gear 22 and the internal gear 24 are rotated to relatively rotate the upper plate 14 and lower plate 16 with respect to the carrier plate 10 in rotation, with the front surface and the back surface of each silicon wafer W being contact with the polishing cloths 18 and 20, respectively while supplying a polishing agent to the polishing cloths 18 and 20. Thus, the front surface and the back surface of the plurality of silicon wafers W can be simultaneously polished.

It should be noted that the structure of a double-side polishing apparatus that can be used in a method of double-side polishing a silicon wafer according to this disclosure is not limited to the structure described above, and a sun gear (planetary gear) type or a sun-gearless type in which the carrier plate is circularly moved without rotation can be used.

In this embodiment, for rough grinding of a silicon wafer, a first polishing step of performing double-side polishing while supplying a first polishing agent that is an alkaline aqueous solution containing abrasive grains to the polishing cloths 18 and 20 is performed first, and a second polishing step of performing double-side polishing while supplying a second polishing agent that is an alkaline aqueous solution containing a water-soluble polymer with no abrasive grains to the polishing cloths 18 and 20 is then performed using the double-side polishing apparatus 100 used in the first polishing step.

The first polishing step in this embodiment is performed with a view to removing a natural oxide layer having a thickness of around 5 angstrom to 20 angstrom formed on a surface layer of each silicon wafer W and polishing the silicon wafer W to a substantial target thickness, using a polishing agent containing abrasive grains.

The total polishing amount of the first and second polishing steps is set within a range of roughly 2.5 μm to 10 μm for each surface. In the first polishing step, the double-side polishing is performed to achieve a polishing amount of 80% to 99.5% with respect to the total polishing amount of the first and second polishing steps. When the polishing amount of the first polishing step is less than 80% of the total polishing amount, the second polishing step of a lower polishing rate is required to be performed for a longer time to achieve a target thickness, resulting in reduced productivity. Meanwhile, when the polishing amount of the first polishing step exceeds 99.5% of the total polishing amount, the amount of removal by polishing in the second polishing is too small, thus the effect of reducing the roll off amount of the peripheral portion of the wafer is insufficient.

On the other hand, the second polishing step in this embodiment is performed with a view to reducing the roll off amount of the peripheral portion of the wafer by slightly polishing both surfaces of the silicon wafers W using a polishing agent containing a water-soluble polymer with no abrasive grains. Specifically, in the second polishing step, the double-side polishing is performed to achieve a polishing amount of 0.05 μm to 0.5 μm for each surface. When the polishing amount for each surface is less than 0.05 μm, the effect of reducing the roll off amount of the peripheral portion of the wafer is insufficient. On the other hand, since the polishing agent containing a water-soluble polymer with no abrasive grains has a low polishing rate, a polishing amount exceeding 0.5 μm results in reduced productivity.

In PTL 1, since the first-step polishing using a polishing liquid containing abrasive grains is mainly aimed at removing a native oxide film, its polishing amount is 0.5 μm for each surface, and the target thickness is achieved by performing double-side polishing of 5 μm to 10 μm for each surface by the second-step polishing using a polishing liquid containing a water-soluble polymer with no abrasive grains. By contrast, in this embodiment, the first-stage polishing at a high polishing rate is mainly performed to achieve the target thickness, thereby obtaining high productivity. On the other hand, when a polishing amount of 0.05 μm or more for each surface is ensured in the second-stage polishing, the roll off amount of the peripheral portion of the wafer can be sufficiently reduced.

The pH of either the first polishing agent or the second polishing agent is preferably adjusted to a range of 9 to 12. When the pH is less than 9, the etching action is too weak, and defects due to processing, such as scratches and flaws are easily formed on the surfaces of the silicon wafers. When the pH exceeds 12, the handling of the solution itself is difficult. Further, as an alkaline agent, an alkaline aqueous solution in which any one of a basic ammonium salt, a basic potassium salt, and a base sodium salt is added; an alkali carbonate aqueous solution; or an alkaline aqueous solution in which amine is added is preferably used. Alternatively, an aqueous solution of hydrazine or amines can be used, and amine is desirably used in particular in terms of increasing the polishing rate.

In the first polishing agent, the abrasive grains used may be made of silica, alumina, diamond, etc.; and the abrasive grains preferably contain $SiO_2$ particles for reasons of low cost, dispersibility in the polishing agent, and the ease of controlling the particle diameter of the abrasive grains, etc. The mean primary particle diameter of the abrasive grains can be set to 30 nm to 100 nm when measured by the BET method.

In the second polishing agent, one or more water-soluble polymers selected from nonionic water-soluble polymers are preferably used. Examples include hydroxyethyl cellulose (HEC), polyethylene glycol (PEG), and polypropylene glycol (PPG). The concentration of the water-soluble polymer is preferably 1 ppm or more, more preferably 10 ppm or more in terms of sufficiently reducing the roll off amount of the peripheral portion of the wafers. Further, with a view to preventing the reduction of the productivity due to a significantly reduced polishing rate, the concentration is preferably 200 ppm or less, more preferably 100 ppm or less.

For the polishing cloths 18 and 20, a polishing cloth made of polyester non-woven cloth and a polyurethane polishing cloth can be given as examples, and a foamed polyurethane polishing cloth excellent in the mirror-polishing precision on the polished surfaces of the silicon wafers is desirably used in particular. For the polishing cloths 18 and 20, a Shore D hardness of 70 to 90 according to JIS K 6253-1997/ISO 7619, a compressibility of 1% to 5%, especially 2% to 3% are preferred.

The polishing rate in the first polishing step is preferably 0.1 μm/min to 1.0 μm/min, and the polishing rate in the second polishing step is preferably 0.03 μm/min to 0.5 μm/min.

The rotation speed of the upper and lower plates, the rotation speed of the silicon wafers, the surface pressure, and the polishing agent supply amount may appropriately be set to achieve the above polishing rates. The rotation speed of the upper and lower plates may be set to a range of 5 rpm to 40 rpm through the first and second polishing steps. The surface pressure may be set within a range of 50 g/cm² to 300 g/cm². In the second polishing step, since the polishing agent with no abrasive grains is used, the frictional resistance is high; therefore, the surface pressure in the second polishing step is desirably set lower than the surface pressure in the first polishing by 5% to 40%.

Here, this embodiment is characterized in the technique of switching the first polishing agent and the second polishing agent when performing the first polishing step and the second polishing step using the common double-side polishing apparatus 100. To explain the technical significance of this embodiment, double-side polishing methods according to Comparative Examples 1 are 2 are first described with reference to FIGS. 2 and 3.

Figure 2:
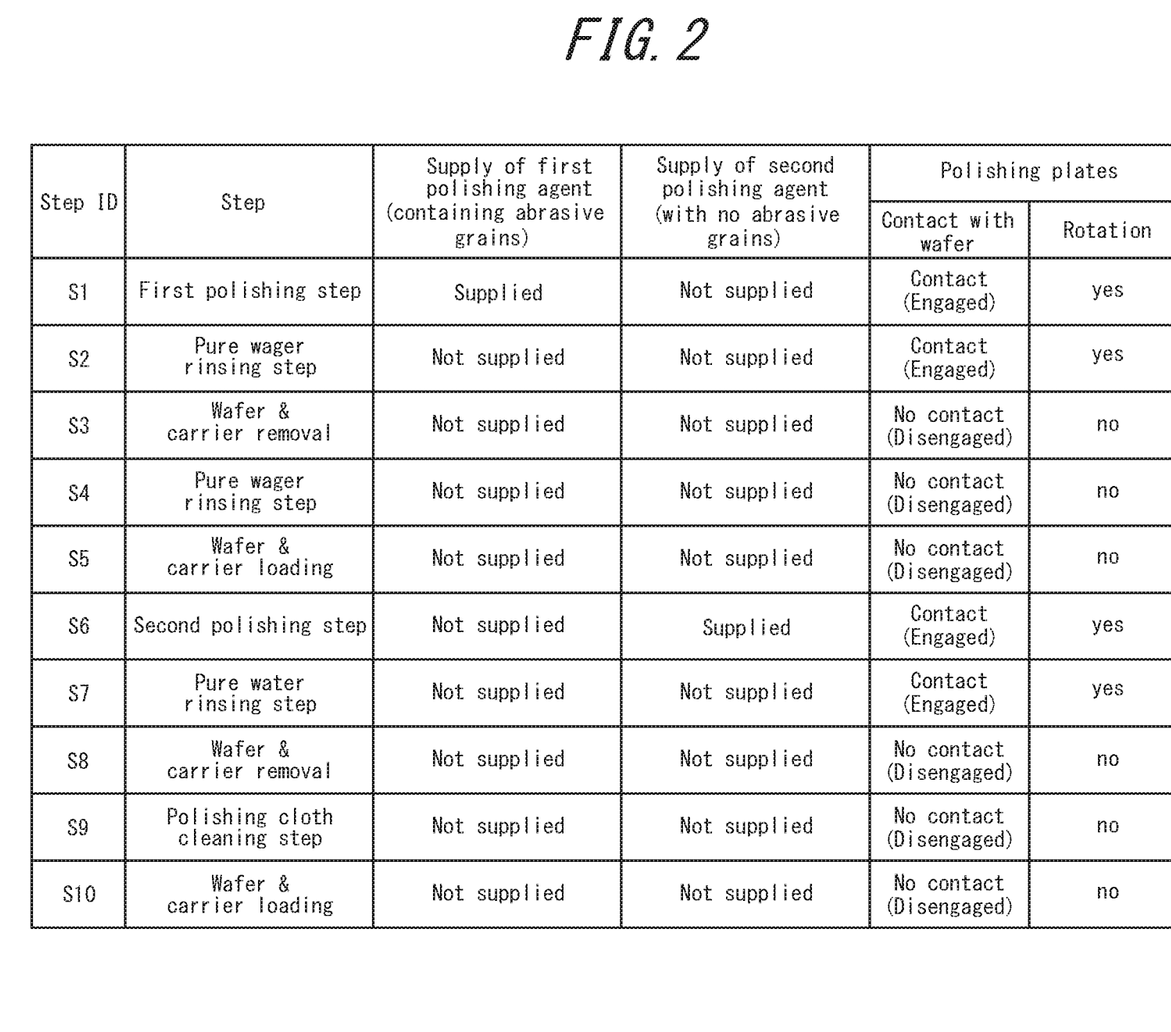
FIG. 2 is a flow diagram of a method of double-side polishing a silicon wafer, according to Comparative Example 1.

Referring to FIG. 2, in the double-side polishing method according to Comparative Example 1, first, the first polishing step is performed by supplying the first polishing agent with the upper and lower plates being in contact with the wafers (engaged) and being rotated (Step S1), and the supply of the first polishing agent is stopped after a lapse of a set time period. Subsequently, pure water rinsing and polishing cloth cleaning are performed after the first polishing step in order to prevent mixing of the first polishing agent with the second polishing agent. Specifically, pure water is supplied to the polishing cloths from the upper plate with the upper and lower plates being engaged with the wafers and being rotated, thereby removing the abrasive grains attached to the wafers or the carrier plate (Step S2). Next, after the rotation of the upper and lower plates is stopped and the supply of the pure water is also stopped, the upper plate is raised to detach the upper plate from the wafers (disengaged), and the carrier plate and the wafers are removed from the lower plate (polishing cloth) (Step S3). Next, pressurized water is sprayed onto the polishing cloths to remove polishing debris, the abrasives, etc. attached to the polishing cloths (Step S4). After finishing the cleaning of the polishing cloths, the carrier plate and the silicon wafers are placed back in the original positions (Step S5). Further, the supply of the second polishing agent is started in a state where the upper and lower plates are engaged with the wafers and the rotation of the plates is stopped, and the rotation of the upper and lower plates is then resumed to perform the second polishing step (Step S6). After a lapse of the sett time period, the supply of the second polishing agent is stopped. After that, like after the first polishing step, pure water rinsing and polishing cloth cleaning are performed (Steps S7 to S10). In this Step S10, unpolished new wafers are loaded. Subsequently, the supply of the first polishing agent is started in a state where the upper and lower plates are engaged with the wafers and the rotation of the plates is stopped, and after that, double-side polishing of the new batch is performed from Step S1 again.

Figure 3:
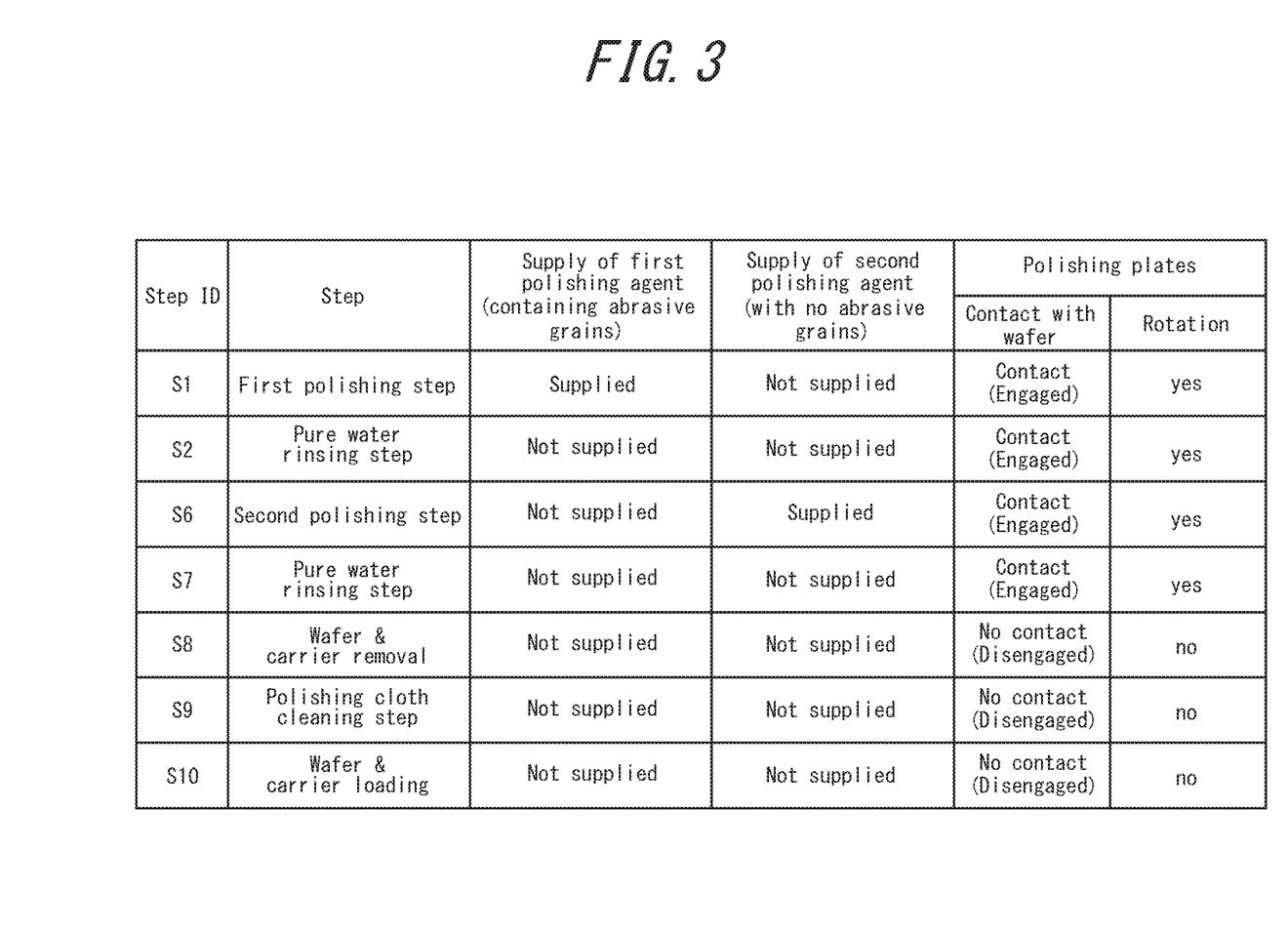
FIG. 3 is a flow diagram of a method of double-side polishing a silicon wafer, according to Comparative Example 2.

Next, referring to FIG. 3, in the double-side polishing method according to Comparative Example 2, in order to shorten the step, only pure water rinsing is performed after the first polishing step while preventing mixing of the first polishing agent and the second polishing agent (Step S2). After that, the supply of the second polishing agent is started, and the rotation of the upper and lower plates is resumed to perform the second polishing step (Step S6). The other steps are the same as those in FIG. 2. This method does not have the polishing cloth cleaning step between the first polishing step and the second polishing step, thus the upper plate is not required to be disengaged from the wafers and reengaged with the wafers.

However, in both Comparative Examples 1 and 2, at the start of the second polishing step (Step S6), the oscillation of the carrier plate occurs. Since the rotation of the upper and lower plates is resumed in the absence of abrasive grains, the frictional resistance between the wafer along with the carrier plate and the polishing cloths increases, thus the oscillation is considered to be caused due to the increased pressure load on the wafer from the upper and lower plates.

Figure 1:
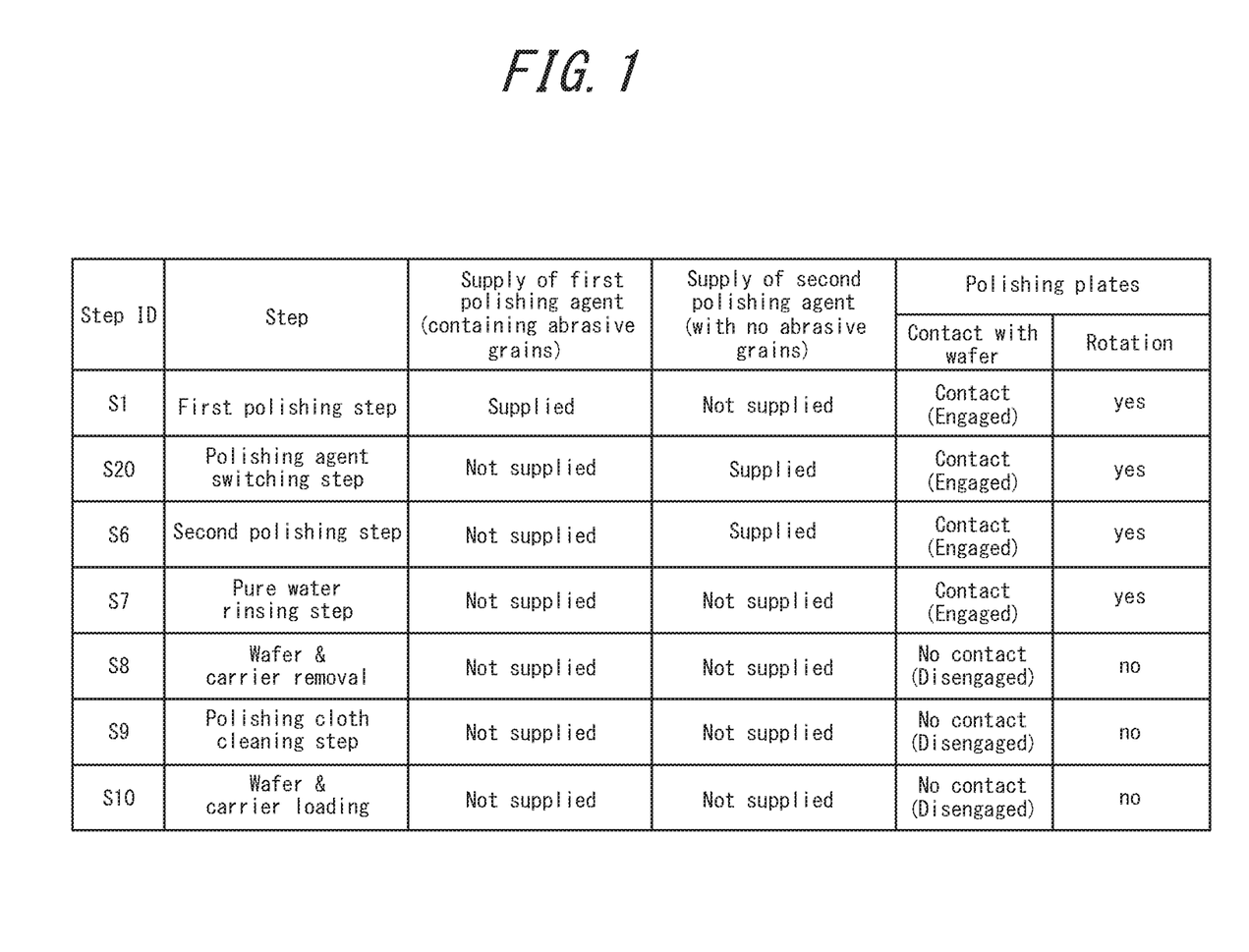
FIG. 1 is a flow diagram of a method of double-side polishing a silicon wafer, according to one embodiment of this disclosure.

On the other hand, referring to FIG. 1, in this embodiment, after the first polishing step, the second polishing is directly started without performing pure water rinsing and polishing cloth cleaning. In other words, after the first polishing step (Step S1), at the same time as the termination of the first polishing agent supply, the supply of the second polishing agent is started with the upper and lower plates being engaged with the wafers and with the plates being continuously rotated (Step S20: polishing agent switching step). The second polishing step (Step S6) is then performed. In this case, the rotation of the upper and lower plates is not resumed in the absence of abrasive grains, and for a certain time period (approximately 20 s) from the start of the second polishing step, the double-side polishing proceeds with a polishing agent that is a mixture of the first polishing agent containing abrasive grains and the second polishing agent with no abrasive grains. Accordingly, the pressure load applied to the wafers by the upper and lower plates does not increase, and the oscillation of the carrier plate can be controlled. This can prevent the formation of micro scratches on the front and back surfaces of the silicon wafers during polishing.

Figure 4:
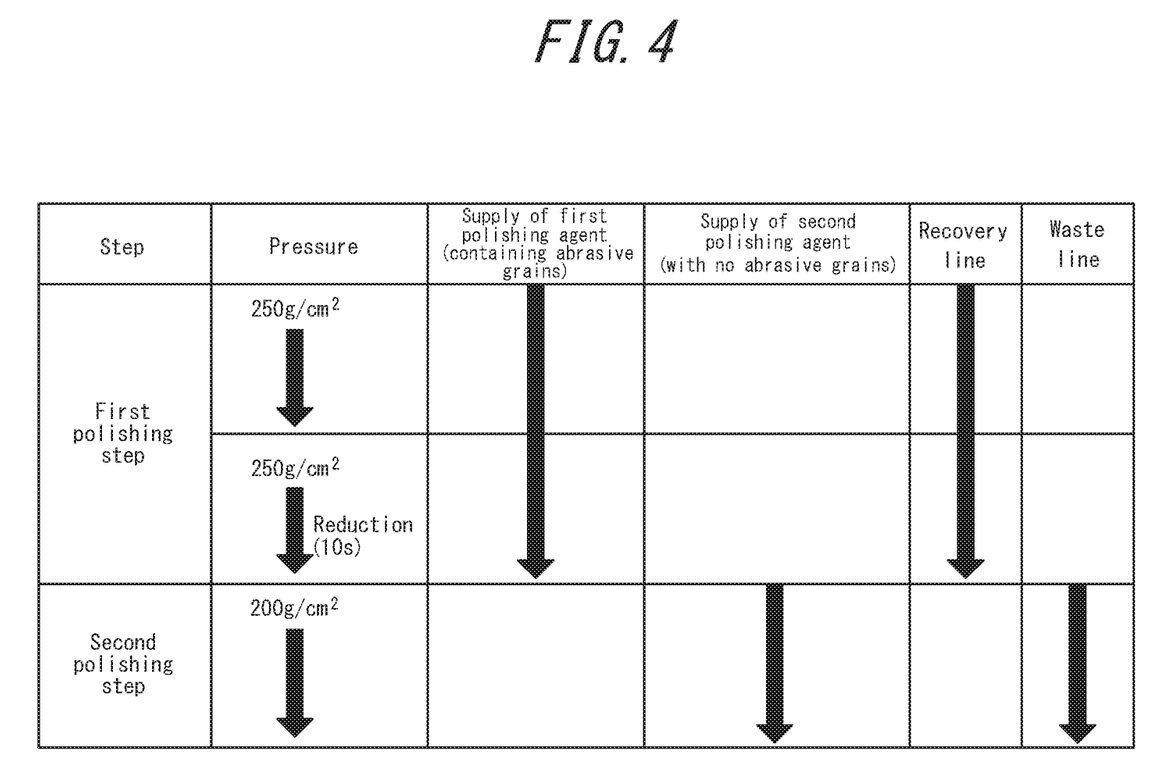
FIG. 4 is a diagram illustrating the switching of the surface pressures applied to silicon wafers, the switching of slurries supplied, and the switching of the methods of processing used polishing agents, in a method of double-side polishing a silicon wafer according to one embodiment of this disclosure.

Note that, in the second polishing step, the first polishing agent containing abrasive grains and the second polishing agent with no abrasive grains are mixed for a certain time period from the start of the second polishing step. Therefore, the recovery, circulation, and reuse of the polishing agent are preferably avoided. In this respect, as illustrated in FIG. 4, in the first polishing step, the recovery line is activated to recover the used first polishing agent, and the recovered agent is then supplied to the polishing cloths again; whereas at the start, of the second polishing step, the recovery line is deactivated and a waste line is activated at the same time to recover the used polishing agent, and the recovered polishing agent is preferably disposed of at all times in the second polishing. As described above, since the second polishing step is very short in time in this embodiment, the polishing agent cost would not be significantly high even if the used polishing agent is not reused.

A supply/recovery system for polishing agents, with which such a method of processing a used polishing agent is implemented is described with reference to FIG. 5. The first polishing agent is supplied from a first polishing agent supply tank 32 to a first polishing agent supply line 30, whereas the second polishing agent is supplied from a second polishing agent supply tank 36 to a second polishing agent supply line 34. The confluence of the lines 30 and 34 is provided with a switching valve 28, and which polishing agent is to be supplied to the polishing agent supply line 26 is controlled by controlling the switching valve. On the other hand, the used polishing agent flows from a recovery system (not shown) placed below the lower plate into a used polishing agent recovery line 38. This line 38 is provided with a switching valve 40 and a waste liquid line 46 diverged at the switching valve. Whether the used polishing agent is transferred to a recovery tank 42 to which the line 38 is connected or to the waste liquid line 46 is controlled by controlling the switching valve 40. The spent waste liquid transferred to the recovery tank 42 is transferred back to the first polishing agent supply tank 32 through a recycling line 44.

In the first polishing step, while the first polishing agent containing abrasive grains is supplied through the first polishing agent supply line 30 by controlling the switching valve 28, the used first polishing agent is recovered into the recovery tank 42 by controlling the switching valve 40 and is reused. In the second polishing step, while the second polishing agent is supplied through the second polishing agent supply line 34 by controlling the switching valve 28, the used polishing agent is disposed of through the waste liquid line 46 by controlling the switching valve 40.

Next, the second polishing step is performed using the second polishing agent with no abrasive grains, thus the frictional resistance between the wafers along with the carrier plate and the polishing cloths easily increases. To address this, with respect to the surface pressure applied to the surfaces of the silicon wafers by the upper and lower plates, the second polishing step is preferably performed at a surface pressure that is lower than the surface pressure in the first polishing step. This can reliably prevent the oscillation of the carrier plate. As a result, the formation of micro scratches on the front and back surfaces of the silicon wafers during polishing can be sufficiently reduced. In this regard, in this embodiment, since the first polishing step and the second polishing step are performed in succession, the surface pressure is reduced in the last stage of the first polishing step, and the surface pressure is reduced to the surface pressure of the second polishing step at the end of the first polishing step as illustrated in FIG. 4.

EXAMPLES

Comparative Example 1

With the use of the double-side polishing apparatus depicted in FIG. 5, silicon wafers with a diameter of 300 mm (five wafers/batch×two batches=10 wafers) were subjected to double-side polishing in accordance with the flow given in FIG. 2. For the first polishing agent, a KOH aqueous solution containing 5% by mass of colloidal silica particles as abrasive grains having a mean primary particle diameter of 70 nm was used. For the second polishing agent, a piperidine aqueous solution containing 10 ppm by mass of hydroxyethyl cellulose (HEC) with no abrasive grains was used. In the first polishing step, polishing was performed at a rotation speed of the upper and lower plates of 15 rpm and a surface pressure of 250 g/cm$^2$, and the polishing amount was 5 μm for each surface. In the second polishing step, polishing was performed at a rotation speed of the upper and lower plates of 15 rpm and a surface pressure of 250 g/cm$^2$, and the polishing amount was 0.5 μm for each surface. A pure water rinsing step for 30 s and a polishing cloth cleaning step for 60 s were performed between the first polishing step and the second polishing step.

Comparative Example 2

With the use of the double-side polishing apparatus depicted in FIG. 5, silicon wafers with a diameter of 300 mm (five wafers/batch×two batches=10 wafers) were subjected to double-side polishing in accordance with the flow given in FIG. 3. Specifically, the same conditions and the same flow as in Comparative Example 1 were used except that the cleaning of the polishing cloths was not performed between the first polishing step and the second polishing step.

Example 1

With the use of the double-side polishing apparatus depicted in FIG. 5, silicon wafers with a diameter of 300 mm (five wafers/batch×two batches=10 wafers) were subjected to double-side polishing in accordance with the flow given in FIG. 1. The first polishing agent and the second polishing agent used were the same as those in Comparative Examples 1 and 2. In the first polishing step, polishing was performed at a rotation speed of the upper and lower plates of 15 rpm and a surface pressure of 250 g/cm$^2$, and the polishing amount was 5 μm for each surface. After that, at the same time as the termination of the supply of the first polishing agent, the supply of the second polishing agent was started with the upper and lower plates being engaged with the wafers and being continuously rotated. In the second polishing step, polishing was performed at a rotation speed of the upper and lower plates of 15 rpm and a surface pressure of 250 g/cm$^2$, and the polishing amount was 0.5 μm for each surface. As illustrated in FIG. 4, the recovery line was activated in the first polishing step, and at the start of the second polishing step, the recovery line was deactivated and the waste liquid line was activated at the same time.

Example 2

As illustrated in FIG. 4, the surface pressure was reduced from 250 g/cm$^2$ to 200 g/cm$^2$ in the last 10 seconds of the first polishing step, and the second polishing step was performed at a surface pressure of 200 g/cm$^2$. Other than that, the same conditions and the flow as in Example 1 were used to perform double-side polishing.

<Evaluation of Micro Scratches>

The back surface of each wafer having been double-side polished was observed using a surface defect inspection system manufactured by KLA-Tencor Corporation: Surfscan SP2, in DWO mode (Darkfield Composite Oblique mode), and the number of light point defects (LPDs) having a defect size of 160 nm or more, observed in the wafer surfaces, was counted as the number of micro scratches formed. The results are given in Table 1.

TABLE 1

| Wafer No. | Comparative Example 1 | Comparative Example 2 | Example 1 | Example 2 |
|---|---|---|---|---|
| No. 01 | 446 | 90 | 22 | 1 |
| No. 02 | 482 | 128 | 19 | 1 |
| No. 03 | 422 | 40 | 20 | 0 |
| No. 04 | 458 | 79 | 22 | 0 |
| No. 05 | 424 | 58 | 22 | 4 |
| No. 06 | 264 | 448 | 27 | 0 |
| No. 07 | 244 | 210 | 20 | 2 |
| No. 08 | 142 | 102 | 13 | 1 |
| No. 09 | 325 | 99 | 17 | 0 |
| No. 10 | 110 | 109 | 9 | 2 |
| Average | 331.7 | 136.3 | 19.1 | 1.1 |

Unit: number per wafer

As described above, many micro scratches were formed in Comparative Examples 1 and 2, whereas micro scratches were reduced in Example 1, and micro scratches were reduced more in Example 2 than in Example 1.

<Wafer Flatness Evaluation>

The ESFQR (Edge Site Front least sQuares Range) of each silicon wafer double-polished in Examples 1 and 2 was evaluated using a flatness measurement system (WaferSight manufactured by KLA-Tencor Corporation). The ESFQR is an evaluation index for the flatness of the edge, of which flatness is easily reduced (site flatness), and indicates the degree of the edge roll-off amount. The ESFQR is defined as the difference between the maximum value and the minimum value of the deviation from the reference plane (Site Best Fit Surface) found by the least square method from the thickness distribution of each site that is a unit area obtained by equally dividing a ring-shaped region along the wafer edge in the circumferential direction. Here, the ESFQR of the 72 sites obtained by dividing a ring-shaped peripheral region set in a range of 2 mm to 32 mm from the outermost periphery of the wafer (sector length: 30 mm) was measured, and the average for all the sites: ESFQR_mean was determined.

As a result, silicon wafers having high flatness with an average ESFQR: ESFQR_mean of 30 nm or less achieved by reducing the edge roll-off were found to be obtained in both Examples 1 and 2.

INDUSTRIAL APPLICABILITY

The method of double-side polishing a silicon wafer prevents the formation of micro scratches on the front and back surfaces of the silicon wafer during polishing.

REFERENCE SIGNS LIST

100: Double-side polishing apparatus
10: Carrier plate
12: Retainer opening
14: Upper plate
16: Lower plate
18, 20: Polishing cloth
22: Sun gear
24: Internal gear
26: Polishing agent supply line
28: Switching valve
30: First polishing agent supply line
32: First polishing agent supply tank
34: Second polishing agent supply line
36: Second polishing agent supply tank
38: Used polishing agent recovery line
40: Switching valve
42: Recovery tank
44: Recycling line
46: Waste liquid line
W: Silicon wafer

The invention claimed is:

1. A method of double-side polishing a silicon wafer using a double-side polishing apparatus that includes a carrier plate having one or more retainer openings for retaining the silicon wafer, and an upper plate and a lower plate that each has a surface provided with a polishing cloth and are situated to face each other with the carrier plate therebetween, for simultaneously polishing a front surface and a back surface of the silicon wafer by relatively rotating the upper plate and the lower plate with respect to the carrier plate in rotation with the polishing cloths of the upper plate and the lower plate being in contact with the front surface and the back surface of the silicon wafer loaded in each retainer opening, respectively, comprising in succession:

a first polishing comprising performing double-side polishing while supplying a first polishing agent that is an alkaline aqueous solution containing abrasive grains to the polishing cloths;

subsequent to the first polishing, with the polishing cloths of the upper plate and the lower plate being in contact with the front surface and the back surface of the silicon wafer, respectively, and with the upper plate and the lower plate being continuously rotated:

stopping the supply of the first polishing agent to the polishing cloths and starting the supply of a second polishing agent to the polishing cloths that is an alkaline aqueous solution containing a water-soluble polymer with no abrasive grains, allowing the second polishing agent to mix with an amount of the first polishing agent that remains on the polishing cloths at the time the supply of the first polishing agent is stopped, and polishing the silicon wafer with the mixture of the first polishing agent and the second polishing agent; and performing a second polishing comprising double-side polishing while supplying the second polishing agent to the polishing cloths after switching the first polishing agent;

wherein:

in the first polishing, the double-side polishing is performed to achieve a polishing amount of 80% to 99.5% with respect to a total polishing amount of the first and second polishings, and in the second polishing, the double-side polishing is performed in a polishing amount of 0.05 µm to 0.5 µm on each surface.

2. The method of double-side polishing a silicon wafer, according to claim 1, wherein with respect to surface pressure applied to the front surface and the back surface of the silicon wafer by the upper plate and the lower plate, in the first polishing, the double-side polishing is performed at a first surface pressure and the surface pressure is reduced in a last stage of the first polishing to a second surface pressure that is lower than the first surface pressure at the end of the first polishing, and the double-side polishing is performed at the second surface pressure in the second polishing.

3. The method of double-side polishing a silicon wafer, according to claim 2, wherein the second surface pressure is lower than the first surface pressure by 5% to 40%.

4. A method of double-side polishing a silicon wafer using a double-side polishing apparatus that includes a carrier plate having one or more retainer openings for retaining the silicon wafer, and an upper plate and a lower plate that each has a surface provided with a polishing cloth and are situated to face each other with the carrier plate therebetween, for simultaneously polishing a front surface and a back surface of the silicon wafer by relatively rotating the upper plate and the lower plate with respect to the carrier plate in rotation with the polishing; cloths of the upper plate and the lower plate being in contact with the front surface and the back surface of the silicon wafer loaded in each retainer opening, respectively, comprising in succession:

a first polishing comprising performing double-side polishing while supplying a first polishing agent that is an alkaline aqueous solution containing abrasive grains to the polishing cloths;

subsequent to the first polishing, with the polishing cloths of the upper plate and the lower plate being in contact with the front surface and the back surface of the silicon wafer, respectively, and with the upper plate and the lower plate being continuously rotated:

stopping the supply of the first polishing agent to the polishing cloths and starting the supply of a second polishing agent to the polishing cloths that is an alkaline aqueous solution containing a water-soluble polymer with no abrasive grains, allowing the second polishing agent to mix with an amount of the first polishing; agent that remains on the polishing; cloths at the time the supply of the first polishing agent is stopped, and polishing the silicon wafer with the mixture of the first polishing agent and the second polishing agent; and performing a second polishing comprising double-side polishing while supplying the second polishing agent to the polishing cloths after switching the first polishing agent, wherein:

in the first polishing, the first polishing agent having been used is recovered and then resupplied to the polishing cloths, and in the second polishing, the polishing agent having been used is recovered and then disposed of.

* * * * *

UNITED STATES PATENT AND TRADEMARK OFFICE
CERTIFICATE OF CORRECTION

PATENT NO. : 11,170,988 B2
APPLICATION NO. : 16/638796
DATED : November 9, 2021
INVENTOR(S) : R. Tanimoto et al.

Page 1 of 1

It is certified that error appears in the above-identified patent and that said Letters Patent is hereby corrected as shown below:

In the Claims

At Column 12, Line 44 (Claim 4), please change "polishing; cloths" to -- polishing cloths --.
At Column 12, Line 63 (Claim 4), please change "polishing; agent" to -- polishing agent --.
At Column 12, Line 64 (Claim 4), please change "polishing; cloths" to -- polishing cloths --.

Signed and Sealed this
Twenty-ninth Day of March, 2022

Drew Hirshfeld
*Performing the Functions and Duties of the
Under Secretary of Commerce for Intellectual Property and
Director of the United States Patent and Trademark Office*